United States Patent [19]
Wingate et al.

[11] Patent Number: 5,939,879
[45] Date of Patent: *Aug. 17, 1999

[54] MAGNETIC ENCODER FOR SENSING POSITION AND DIRECTION VIA A TIME AND SPACE MODULATED MAGNETIC FIELD

[75] Inventors: Sidney A. Wingate, Concord, Mass.; Christopher W. Liessner, Derry, N.H.; John A. Sotir, Newton, Mass.

[73] Assignee: Dynamics Research Corporation, Wilmington, Mass.

[*] Notice: This patent issued on a continued prosecution application filed under 37 CFR 1.53(d), and is subject to the twenty year patent term provisions of 35 U.S.C. 154(a)(2).

[21] Appl. No.: 08/867,732

[22] Filed: Jun. 2, 1997

Related U.S. Application Data

[60] Provisional application No. 60/022,288, Jul. 23, 1996.

[51] Int. Cl.$^6$ .............................. H03M 1/24; G01B 7/30; G01B 7/12; G01P 13/00
[52] U.S. Cl. ............................... 324/207.17; 324/207.18; 324/207.22; 324/207.25; 336/200; 341/15
[58] Field of Search .................................... 324/164, 165, 324/173, 207.17–207.19, 207.22, 207.25; 235/449; 341/15; 336/45, 79, 200

[56] References Cited

U.S. PATENT DOCUMENTS

| | | | |
|---|---|---|---|
| 2,706,805 | 4/1955 | Clewell | 324/164 X |
| 3,281,825 | 10/1966 | Corl et al. | 324/207.17 X |
| 3,786,354 | 1/1974 | Lasky | 324/173 |
| 3,820,110 | 6/1974 | Henrich et al. | 341/15 |
| 4,156,192 | 5/1979 | Schedrovitsky et al. | 324/208 |
| 4,507,638 | 3/1985 | Brosh | 324/207.17 X |
| 4,654,636 | 3/1987 | Rusk | 341/13 |
| 4,777,436 | 10/1988 | Fiori, Jr. | 324/207.17 |

*Primary Examiner*—Gerard Strecker
*Attorney, Agent, or Firm*—Weingarten, Schurgin, Gagnebin & Hayes LLP

[57] ABSTRACT

A magnetic encoder is disclosed that provides a uniform magnetic field which is time modulated at a carrier frequency and space modulated by a repetitive pattern of eddy-current conducting lands that move with variable motion. The time modulation is provided by driving an electrical coil in a resonant tank circuit. The space modulation provides areas of higher and lower magnetic field intensity which change in correspondence with the motion of the conducting lands. The intensity of the varying magnetic field is detected by a series connected pair of stationary coils that are positioned orthogonal to both the direction of the changing magnetic field and the direction of the motion of the conducting lands. The pair of stationary coils yield a differential electrical signal that is representative of the motion of the conducting lands.

19 Claims, 7 Drawing Sheets

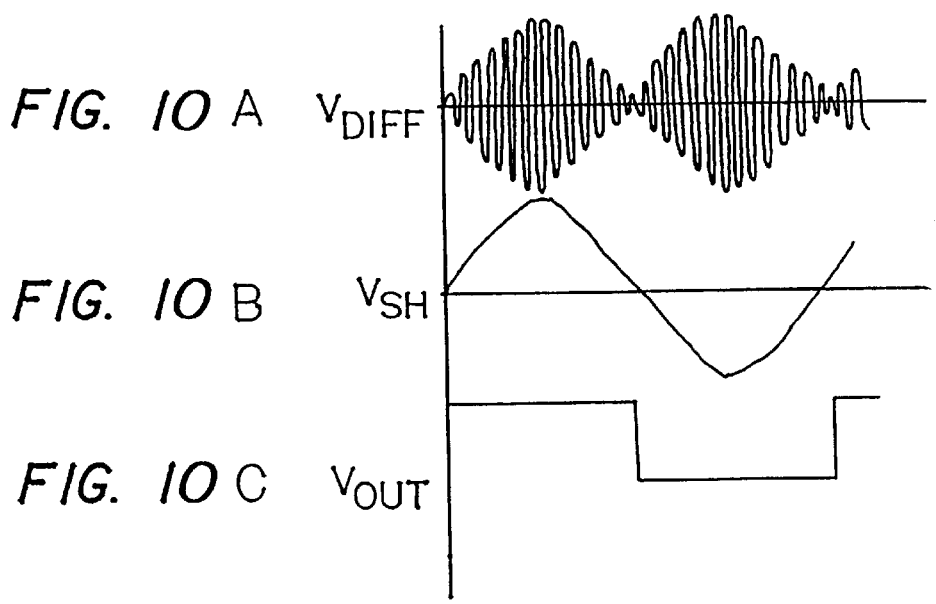
FIG. 10 A $V_{DIFF}$
FIG. 10 B $V_{SH}$
FIG. 10 C $V_{OUT}$
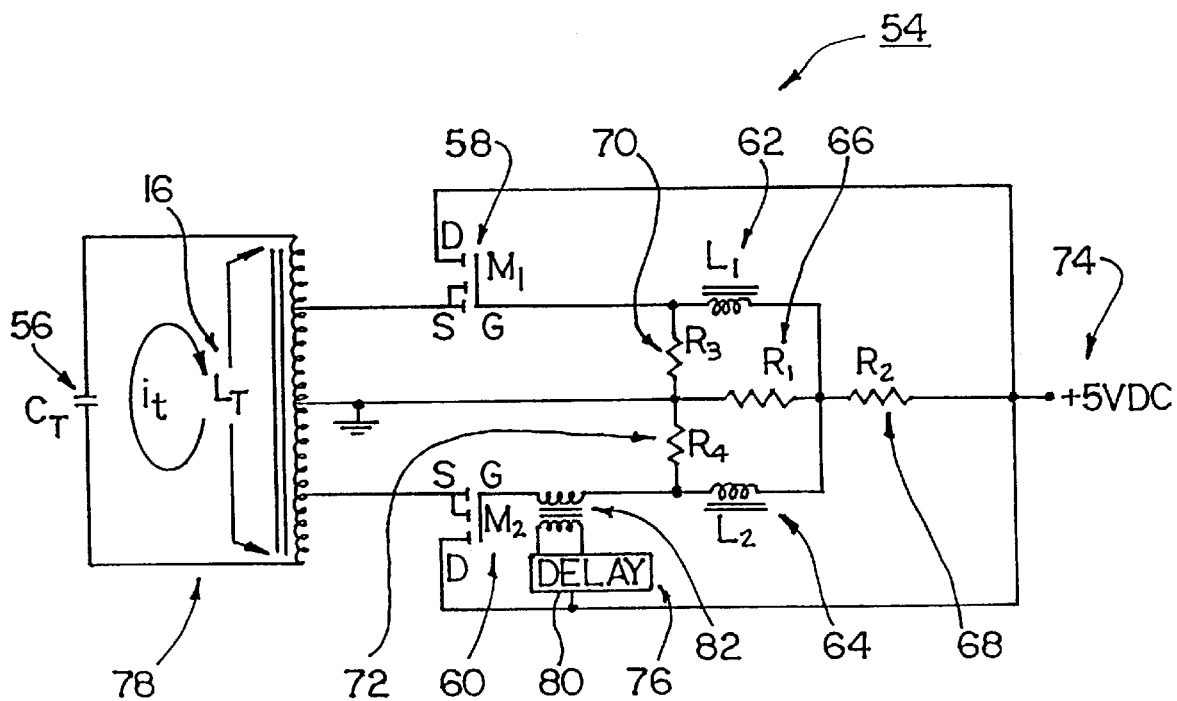
FIG. 11

MAGNETIC ENCODER FOR SENSING POSITION AND DIRECTION VIA A TIME AND SPACE MODULATED MAGNETIC FIELD

CROSS REFERENCE TO RELATED APPLICATIONS

This application claims the benefit of provisional application No. 60/022,288 filed Jul. 23, 1996.

STATEMENT REGARDING FEDERALLY SPONSORED RESEARCH OR DEVELOPMENT

FIELD OF THE INVENTION

The present invention relates generally to magnetic encoders and, more particularly, to a magnetic encoder for sensing position and direction via a time and space modulated magnetic field.

BACKGROUND OF THE INVENTION

Optical, magnetic, and capacitive encoders have existed for many years to provide incremental and absolute motion signals for indicating position for feedback, display, or computing purposes. Optical encoders require an uncontaminated light path from an emitter, through a transmission modulating pattern, to a light sensor. Magnetic and capacitive encoders require paths that provide areas for modulation and detection of energy fields by a moving pattern of code elements with magnetic or electrostatic properties. For example, rotary magnetic encoders are often implemented with a rotatable drum embedded with alternating permanent magnetic poles and a stationary detector array of magnetoresistive elements which sense alternating permanent magnetic fields as the drum is rotated. In some environments, the permanent magnetic fields will attract and hold ferromagnetic particles that can damage or destroy the encoder. Also, if the operating environment includes extraneous magnetic fields from peripheral equipment, such magnetic fields can corrupt the function of the encoder. Furthermore, very high extraneous magnetic field intensities can cause permanent damage to the encoder. Accordingly, it would be desirable to provide a magnetic encoder which does not exhibit and is not subject to the above-mentioned shortcomings.

SUMMARY OF THE INVENTION

The present invention contemplates a magnetic encoder that provides a magnetic field which is time modulated at a carrier frequency and space modulated by a repetitive pattern of eddy-current conducting lands that move with variable motion. The time modulation is provided by driving an electrical coil in a resonant tank circuit so as to produce a uniform AC magnetic field. The space modulation is provided by moving the conducting lands through the uniform AC magnetic field so as to produce areas of higher and lower magnetic field intensity. The intensity of the resulting time and space modulated magnetic field is detected by a series connected pair of stationary coils that are positioned orthogonal to both the direction of the uniform AC magnetic field and the direction of motion of the conducting lands. The pair of stationary coils yield a differential electrical signal that is representative of the motion of the conducting lands.

In a preferred embodiment, the repetitive pattern of eddy-current conducting lands is provided on a rotatable disc that is fabricated of a material which exhibits no magnetic properties. The conducting lands are formed on the disc in an incremental track of radially arranged areas of conducting material which are separated by nonconducting areas. The series connected pair of stationary coils are formed on a multilayer printed circuit board which is positioned proximate the time and space modulated magnetic field.

A primary object of the present invention is to provide a magnetic encoder without any requirement for permanent magnetic patterns, either in a moving element or in stationary elements.

Another object of the present invention is to use a moving array of inexpensive conducting lands which do not require special magnetic properties.

Another object of the present invention is to use a second track with one or more coded patterns for absolute position orientation.

Another object of the present invention is to use a carrier frequency excitation for a magnetic field that is high enough to exclude AC fields of nearby rotating or vibrating machinery, and that allows spectral filtering against ambient RF interference.

Another object of the present invention is to use a carrier frequency excitation for a magnetic field, wherein the total flux path includes a field-forming high-permeability structure with excitation coils that are made to resonate with a capacitor at a desired frequency, wherein oscillation in the resonant circuit is sustained by periodic current injection from a pair of MOSFET or other electronic switches triggered by feedback from coils in the resonant circuit, thereby eliminating the need for an independently tuned oscillator matched to the resonant circuit.

In summary, the present invention achieves the above-mentioned objects and others by providing an air gap area therefor positioned within a highly permeable flux path for a uniform AC magnetic field, and providing a movable track of isolated conducting lands insertable into the gap area. Each conducting land reacts to the uniform AC magnetic field by creating eddy currents whose magnetic fields oppose the uniform AC magnetic field within each land area and aid the uniform AC magnetic field between the lands. The resulting modulated magnetic field moves with any land pattern motion. The modulated magnetic field induces voltages, via Faraday's Induction Law, in a stationary sensor coil pattern that interleaves loops of a pair of sensor coils with a spatial cycle length equal to the cycle length of the land pattern. A series connection of the pair of sensor coils yields a differential voltage signal that represents the motion of the land pattern. Phase detection of the differential voltage signal provides a bipolar signal that may be squared up with a comparator to provide a square-wave output signal. Two or more such channels, phase-displaced in the motion direction, yield direction outputs for counting in the usual manner. An additional parallel track of conducting lands may provide one or more reference points, which are combined with the incremental track outputs to give an absolute position reading. For efficient induction sensing, the additional track may be divided into a complementary triple array, as another feature of the present invention.

The above-mentioned objects, as well as other objects, features, and advantages, of the present invention will become readily apparent from the following detailed description which is to be read in conjunction with the appended drawings.

BRIEF DESCRIPTION OF THE DRAWINGS

In order to facilitate a fuller understanding of the present invention, reference is now made to the appended drawings.

These drawings should not be construed as limiting the present invention, but are intended to be exemplary only.

FIG. 10A is a waveform of a differential voltage signal from a set of sensor coil windings in the magnetic encoder shown in FIG. 1.

FIG. 10B is a waveform of a bipolar voltage signal from a sample-hold phase detector in the magnetic encoder shown in FIG. 1.

FIG. 10C is a waveform of a square wave voltage signal from a comparator in the magnetic encoder shown in FIG. 1.

FIG. 11 is an oscillator circuit for driving an electrical coil on the ferrite core head in the magnetic encoder shown in FIG. 1.

DETAILED DESCRIPTION OF THE INVENTION

Figure 1:
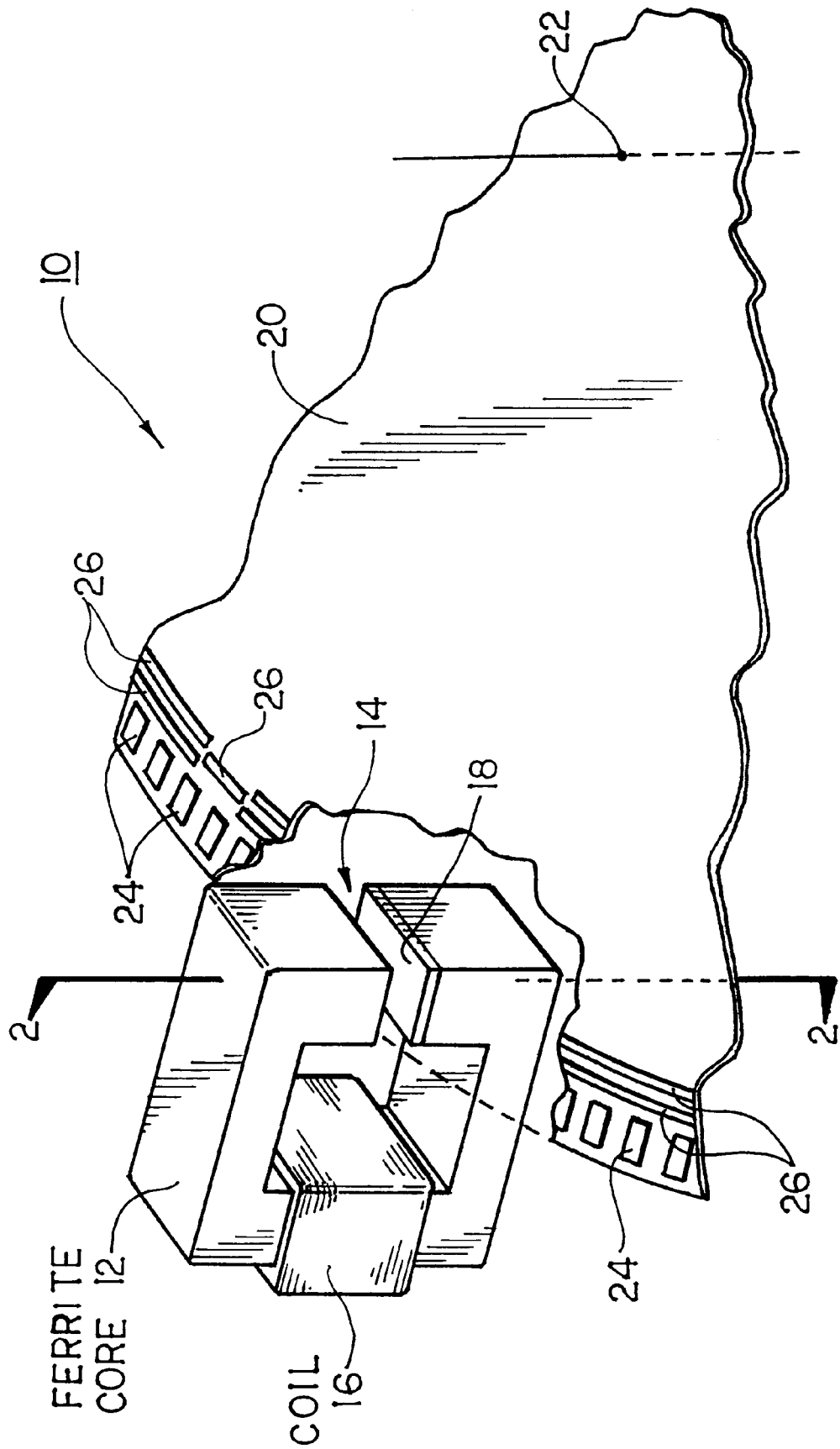
FIG. 1 is a perspective view of a magnetic encoder in accordance with the present invention.

Referring to FIG. 1, there is shown a perspective view of a magnetic encoder 10 in accordance with the present invention. The magnetic encoder 10 comprises a ferrite core head 12 having an air gap area 14. The ferrite core head 12 is energized by current passing through an electrical coil 16. The electrical coil 16, having N turns, is driven with an AC current $i_r$ at a carrier frequency $f_r$ in a resonant tank circuit (see FIG. 11). Thus, the air gap area 14 is filled with a uniform magnetic field oscillating at the carrier frequency $f_r$.

A multilayer printed circuit board 18 is secured to the ferrite core head 12 in the air gap area 14. The printed circuit board 18 has sensor coil windings formed thereon (see FIGS. 6 and 7) for sensing changes in the uniform magnetic field in the air gap area 14.

A rigid disc 20 (only a portion of which is shown, and, from that, a portion of which is cut away for purposes of clarity) is mounted for rotation about a shaft 22 such that the outer portion of the disc 20 rotates through the air gap area 14. The disc 20 has a track of radially positioned conducting lands 24 and a track of concentrically positioned conducting traces 26 formed on the surface thereof. It should be noted that the conducting lands 24 and the conducting traces 26 may be formed on either side of the disc 20.

Figure 2:
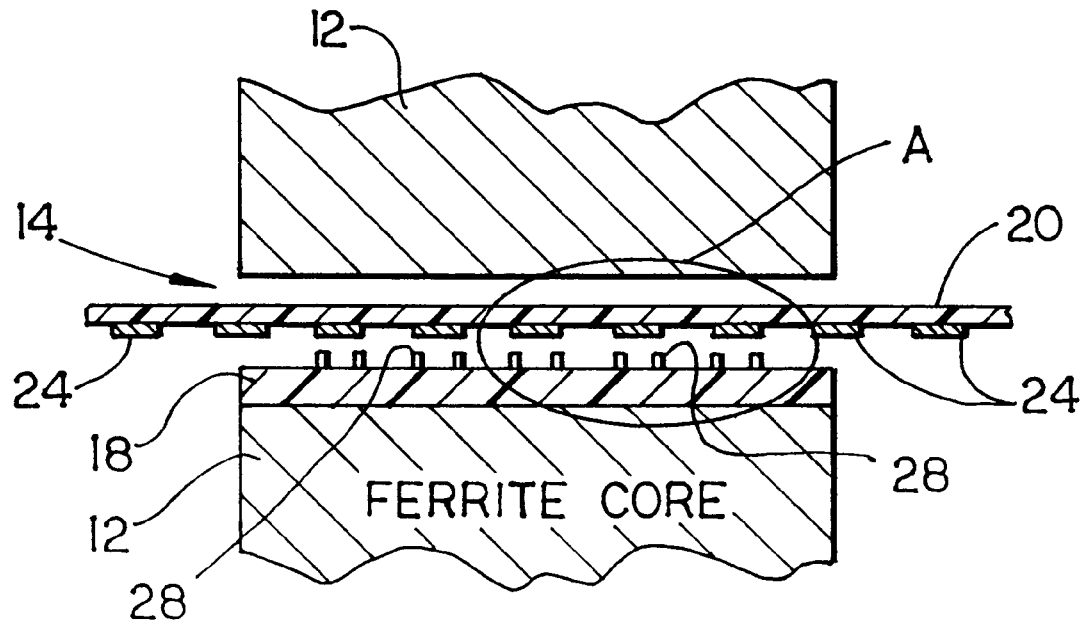
FIG. 2 is a cross-sectional view of the ferrite core head in the magnetic encoder shown in FIG. 1, taken along line 2—2 of FIG. 1.

Referring to FIG. 2, there is shown a cross-sectional view of the ferrite core head 12 in area of the air gap area 14. Some sensor coil windings 28, which are formed on the top layer of the multilayer printed circuit board 18, are shown to illustrate the spacing of the sensor coil windings 28 in relation to the conducting lands 24.

Figure 3:
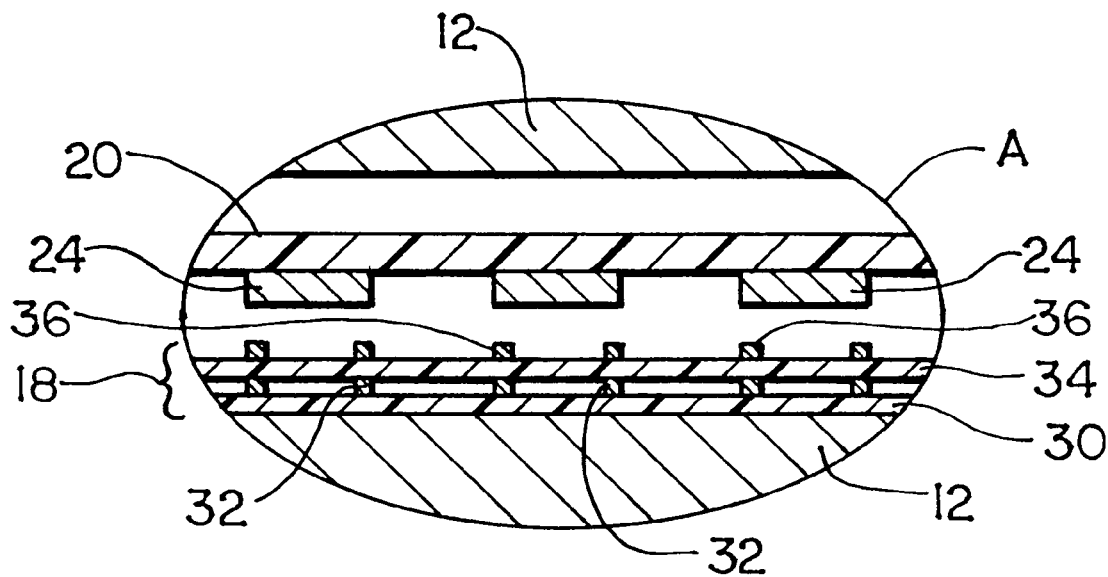
FIG. 3 is a detailed view of the air gap area in the ferrite core head of the magnetic encoder shown in FIG. 1, taken from oval A in of FIG. 2.

Referring to FIG. 3, there is shown a detailed view of the air gap area 14. The multilayer printed circuit board 18 comprises a first layer 30 upon which a first set of sensor coil windings 32 are formed, and a second layer 34 upon which a second set of sensor coil windings 36 are formed. The second set of sensor coil windings 36 correspond to the sensor coil windings 28 shown in FIG. 2.

Figure 4:
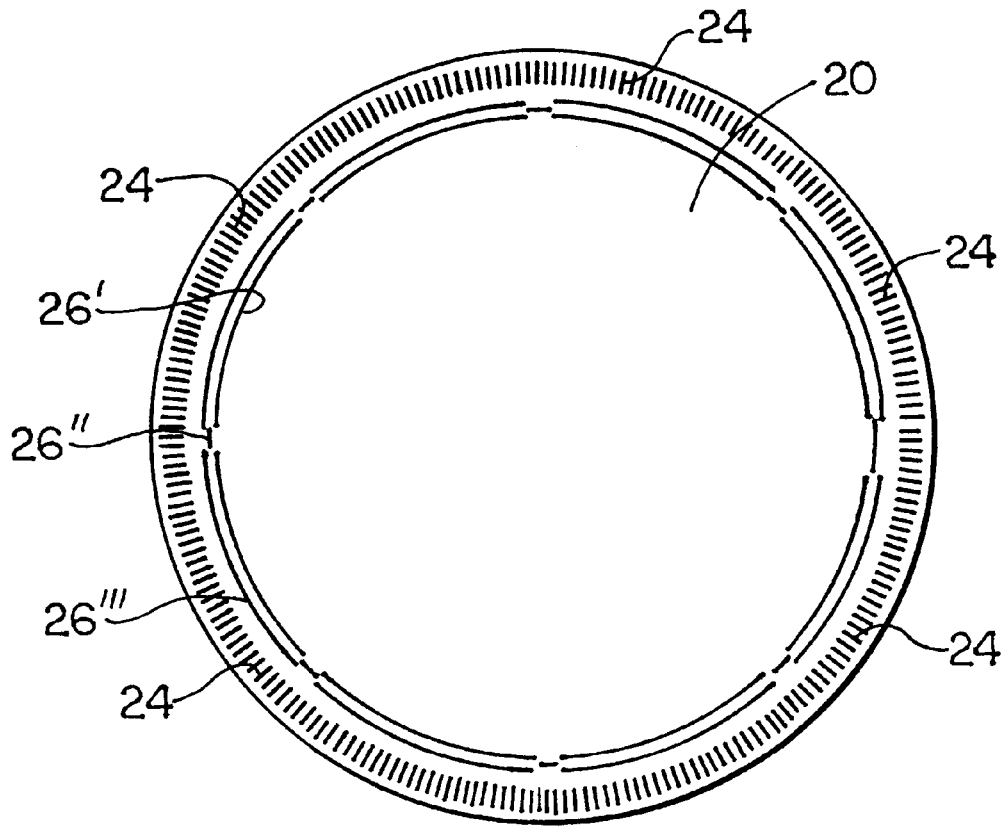
FIG. 4 is a plan view of the disc in the magnetic encoder shown in FIG. 1.

Referring to FIG. 4, there is shown a plan view of the entire disc 20 with the conducting lands 24 and the conducting traces 26. The disc 20 is preferably made from a rigid material that is mechanically stable and withstands the adverse effects of temperature, moisture, etc. The disc 20 must also not exhibit any magnetic properties (i.e., must be transparent to magnetic fields).

All of the conducting lands 24 are of equal size and are equally spaced from one another. Also, all of the conducting lands 24 are equally distant from the center of the disc 20. The conducting lands 24 are preferably formed with copper, but any number of electrically conducting materials may suffice. As described in detail below, the conducting lands 24 provide for incremental position reading.

The conducting traces 26 comprise an inner conducting trace 26', a middle conducting trace 26", and an outer conducting trace 26'". In this particular embodiment, the inner 26', middle 26", and outer 26'" conducting traces are arranged to form eight reference points, with one point being larger than the others. Like the conducting lands 24, the conducting traces 26 are preferably formed with copper, but any number of electrically conducting materials may suffice. As described in detail below, the conducting traces 26 provide for absolute position reading.

Figure 5:
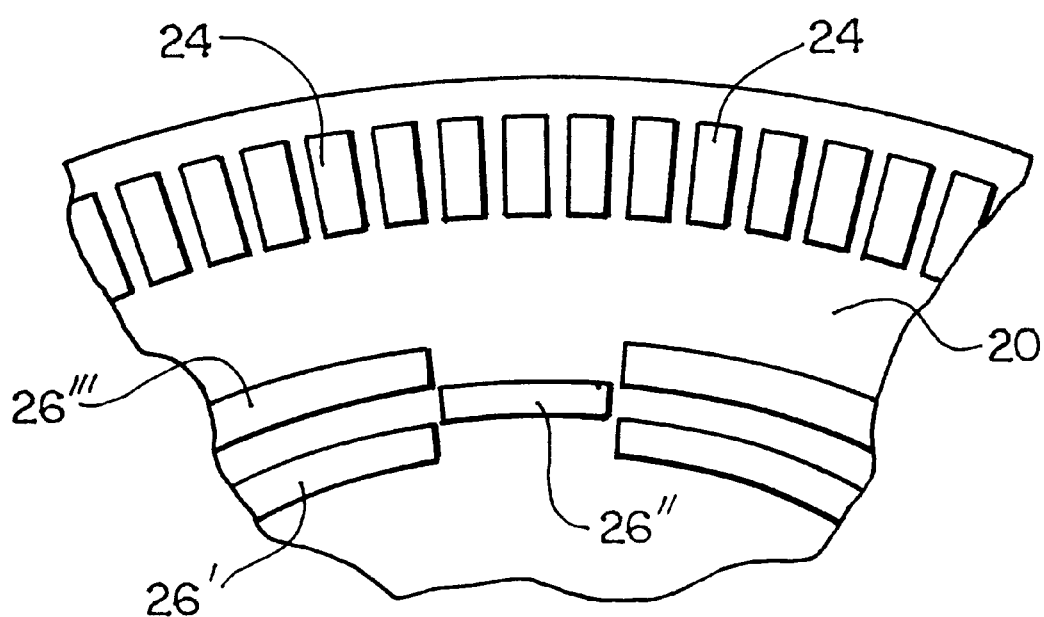
FIG. 5 is a plan view of a section of the disc in the magnetic encoder shown in FIG. 1.

Referring to FIG. 5, there is shown a detailed section of the disc 20 with the conducting lands 24 and the inner 26', middle 26", and outer 26'" conducting traces. it should be noted that the conducting lands 24 and the inner 26', middle 26", and outer 26'" conducting traces must be electrically isolated from one another.

Figure 6:
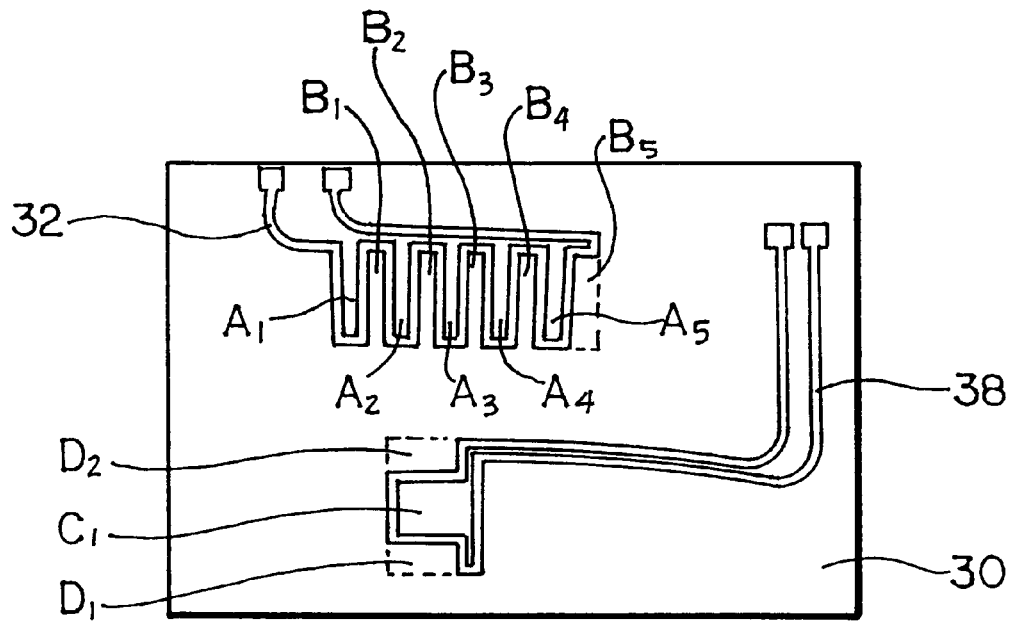
FIG. 6 is a plan view of the first layer of the multilayer printed circuit board in the magnetic encoder shown in FIG. 1.
Figure 7:
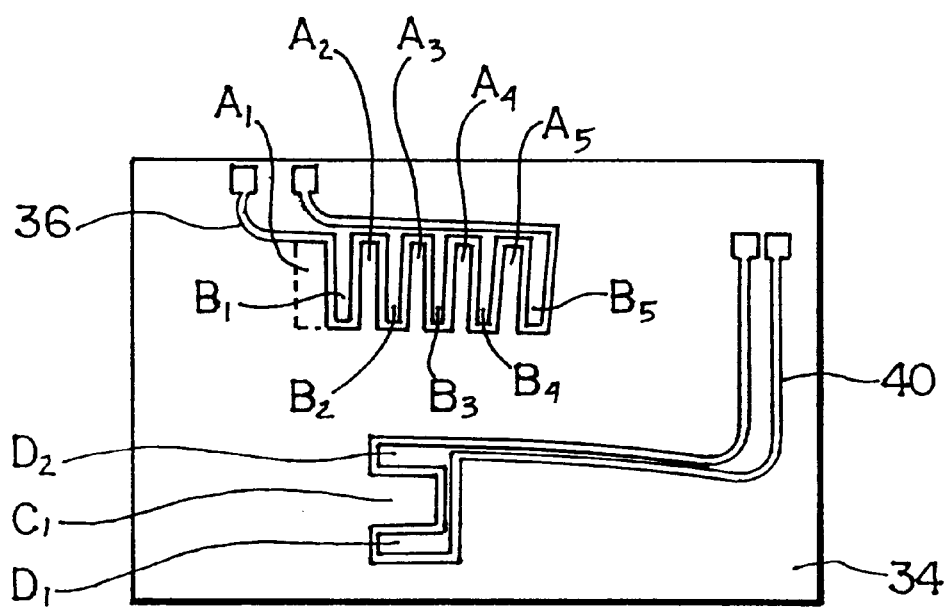
FIG. 7 is a plan view of the second layer of the multilayer printed circuit board in the magnetic encoder shown in FIG. 1.

Referring to FIGS. 6 and 7, there are shown the first layer 30 and the second layer 34, respectively, of the multilayer printed circuit board 18. It should first be noted that all of the layers of the multilayer printed circuit board 18 must be fabricated of materials which do not exhibit any magnetic properties (i.e., are transparent to magnetic fields).

The first set of sensor coil windings 32 are formed on the surface of the first layer 30, and the second set of sensor coil windings 36 are formed on the surface of the second layer 34. As described below, the first set of sensor coil windings 32 and the second set of sensor coil windings 36 are used to measure modulations in the otherwise uniform magnetic field in the air gap area 14 caused by the conducting lands 24.

A third set of sensor coil windings 38 are formed on the surface of the first layer 30 of the multilayer printed circuit board 18, and a fourth set of sensor coil windings 40 are formed on the surface of the second layer 34 of the multilayer printed circuit board 18. As described below, the third set of sensor coil windings 38 and the fourth set of sensor coil windings 40 are used to measure modulations in the otherwise uniform magnetic field in the air gap area 14 caused by the conducting traces 26.

The first set of sensor coil windings 32 forms closed "A" areas on the surface of the first layer 30 of the multilayer printed circuit board 18, and the second set of sensor coil windings 36 forms closed "B" areas on the surface of the second layer 34 of the multilayer printed circuit board 18. Similarly, the third set of sensor coil windings 38 forms a closed "C" area on the surface of the first layer 30 of the multilayer printed circuit board 18, and the fourth set of sensor coil windings 40 forms closed "D" areas on the surface of the second layer 34 of the multilayer printed circuit board 18.

When the second layer 34 of the multilayer printed circuit board 18 is positioned over the first layer 30 of the multilayer printed circuit board 18, the second set of sensor coil windings 36 and the fourth set of sensor coil windings 40 are positioned over the first set of sensor coil windings 32 and the third set of sensor coil windings 38, respectively. This positioning results in all of the closed areas of the first layer 30 (the "A" and "C" closed areas) being superposed on the second layer 34, and all of the closed areas of the second layer 34 (the "B" and "D" closed areas) being superposed on the first layer 30, as shown in FIGS. 6 and 7.

In accordance with Faraday's Induction Law, any changes that occur in the uniform magnetic field in the closed areas of any of the sensor coil windings will induce voltages in those sensor coil windings. For example, any changes that occur in the uniform magnetic field in the closed "A" areas will induce voltages in the first set of sensor coil windings 32, and any changes that occur in the uniform magnetic field in the closed "B" areas will induce voltages in the second set of sensor coil windings 36. Similarly, any changes that occur in the uniform magnetic field in the closed "C" area will induce a voltage in the third set of sensor coil windings 38, and any changes that occur in the uniform magnetic field in the closed "D" areas will induce voltages in the fourth set of sensor coil windings 40.

It should be noted that the first set of sensor coil windings 32 and the second set of sensor coil windings 36 are connected in series so as to yield a differential induced voltage signal, as described below. Similarly, it should be noted that the third set of sensor coil windings 38 and the fourth set of sensor coil windings 40 are connected in series so as to yield a differential induced voltage signal, as described below.

Figure 8:
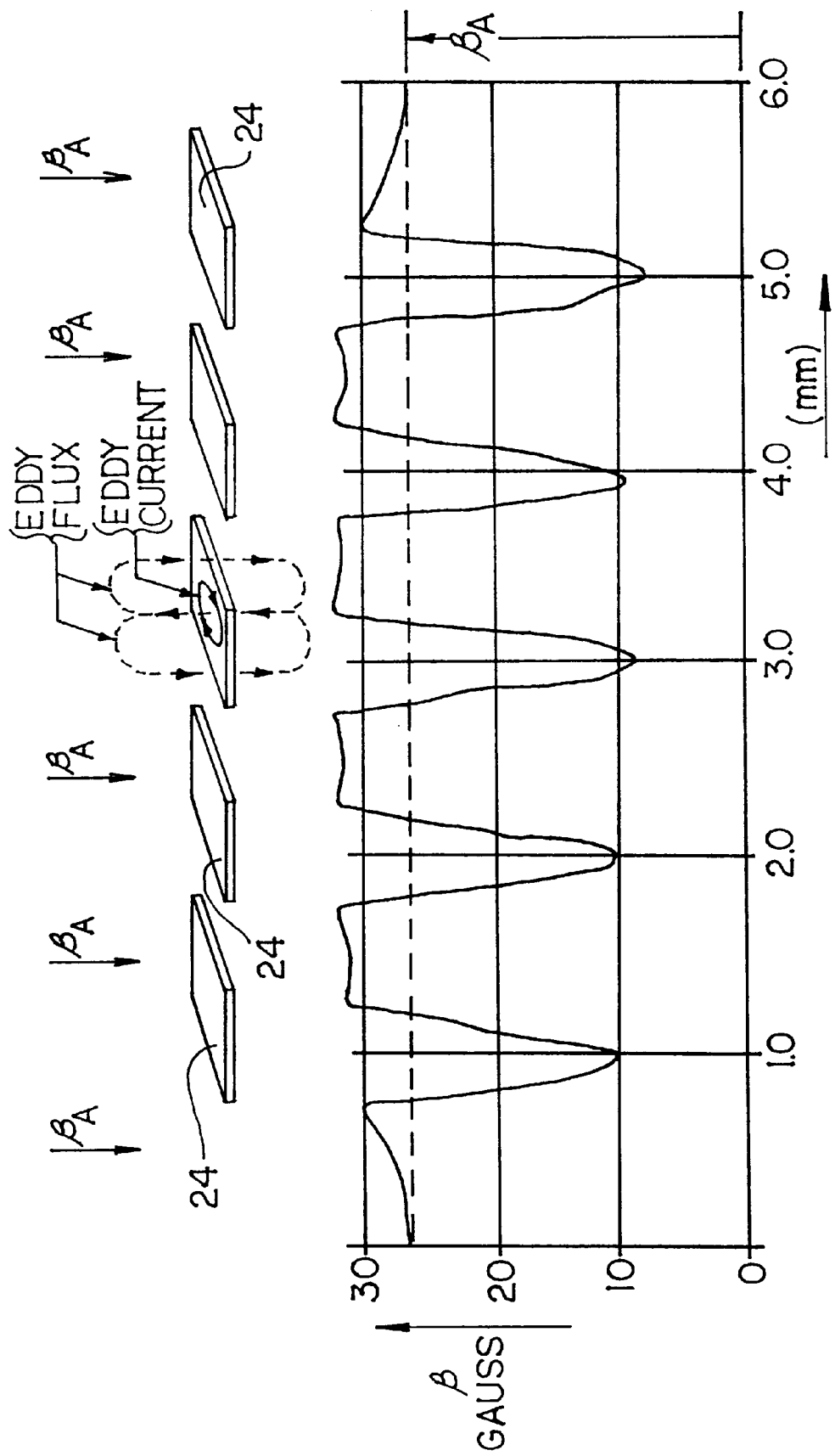
FIG. 8 is a graphical representation of the instantaneous flux density in the air gap area of the magnetic encoder shown in FIG. 1 as a result of interference caused by conducting lands in an applied uniform magnetic field.

Referring to FIG. 8, there is shown a graphical representation of the instantaneous flux density in the air gap area 14 as a result of interference caused by the conducting lands 24 in the applied uniform magnetic field, $B_A$. The applied uniform magnetic field $B_A$, which is oscillating at the carrier frequency $f_t$, is generated in the air gap area 14 by the electrical coil 16. The oscillating nature of the applied uniform magnetic field $B_A$ results in eddy currents being generated in each conducting land 24, as shown. In turn, these eddy currents produce magnetic fields which oppose the applied uniform magnetic field $B_A$ in the area of each conducting land 24, and aid the applied uniform magnetic field $B_A$ in the area between each conducting land 24, as shown. The applied uniform magnetic field $B_A$ becomes modulated as a result of the eddy current generated magnetic fields, as shown. This modulated magnetic field moves with the motion of the conducting lands 24 through the air gap area 14 as a result of the rotation of the disc 20.

As mentioned above, Faraday's Induction Law explains how changes that occur in the uniform magnetic field in the closed areas of any of the sensor coil windings will induce voltages in those sensor coil windings. Accordingly, the modulated magnetic field that is generated as a result of the eddy current generated magnetic fields described above will induce voltages in the first set of sensor coil windings 32 and the second set of sensor coil windings 36. Since, as described above, the first set of sensor coil windings 32 and the second set of sensor coil windings 36 are series connected, the induced voltages will yield a differential voltage signal that represents the spatial modulation of the conducting lands 24.

Similar to the modulated magnetic field that is produced as a result of the eddy currents that are generated in the conducting lands 24, a modulated magnetic field is also produced as a result of eddy currents being generated in the conducting traces 26. This modulated magnetic field will induce voltages in the third set of sensor coil windings 38 and the fourth set of sensor coil windings 40. Since, as described above, the third set of sensor coil windings 38 and the fourth set of sensor coil windings 40 are series connected, the induced voltages will yield a differential voltage signal that represents the spatial modulation of the conducting traces 26.

At this point it should be noted that the differential voltage signals are typically at a very low impedance (e.g., a few ohms at 1.0 megacycle).

Figure 9:
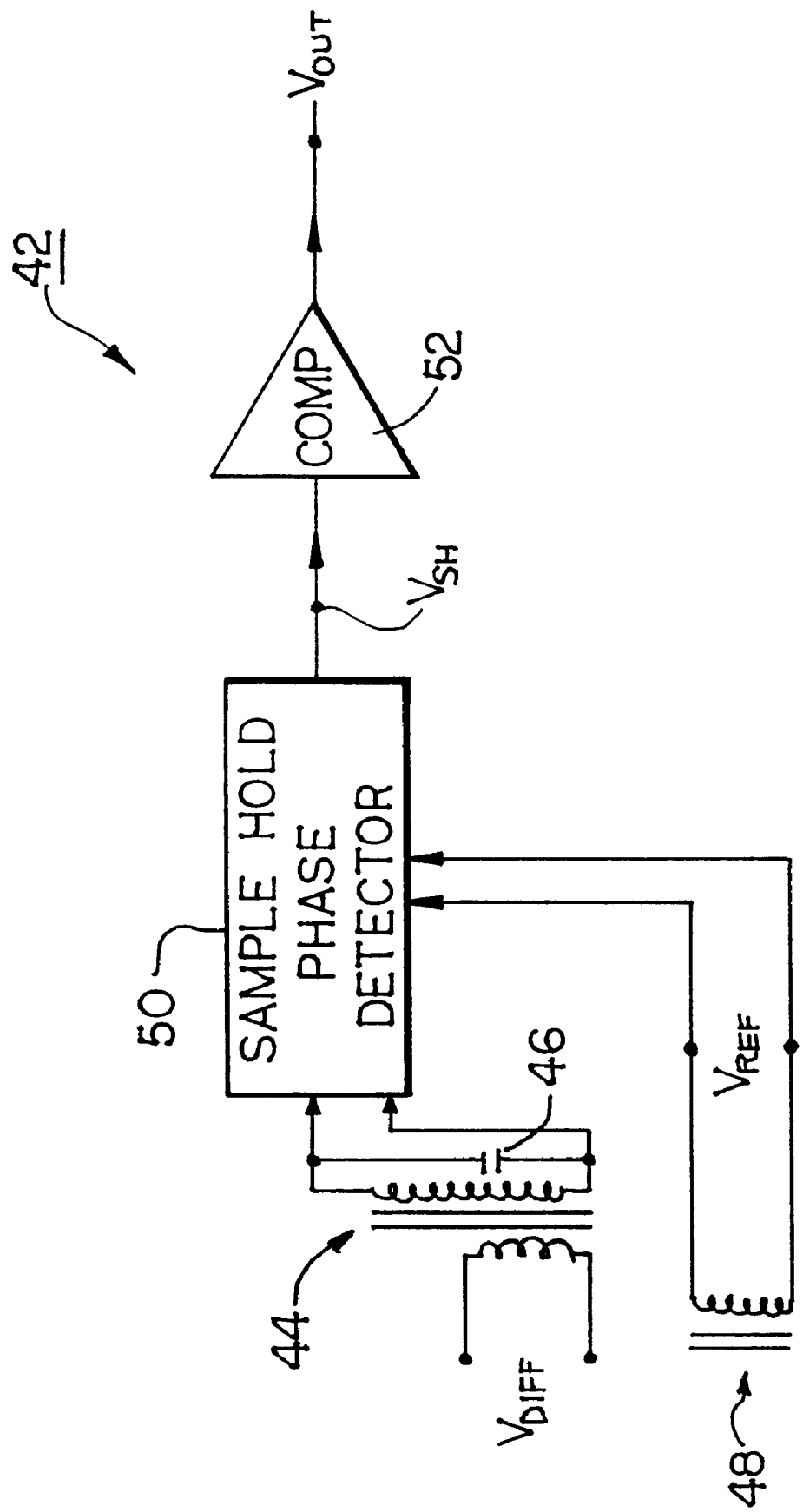
FIG. 9 is a schematic diagram of a circuit for processing a differential voltage signal from a set of sensor coil windings in the magnetic encoder shown in FIG. 1.

Referring to FIG. 9, there is shown a circuit 42 for processing the differential voltage signal, $V_{DIFF}$, from either the first set of sensor coil windings 32 and the second set of sensor coil windings 36, or from the third set of sensor coil windings 38 and the fourth set of sensor coil windings 40. A waveform of the differential voltage signal $V_{DIFF}$ is shown in FIG. 10A.

Referring back to FIG. 9, the differential voltage signal $V_{DIFF}$ is first conditioned by a transformer 44 and a capacitor 46. The transformer 44 steps up the differential voltage signal $V_{DIFF}$, while the combination of the transformer 44 and the capacitor 46, tuned to the carrier frequency $f_t$, provide rejection of potentially interfering ambient magnetic fields, possibly from nearby machinery or from RF sources. A reference coil 48 on the ferrite core head 12 (not shown in FIG. 1) provides a reference signal, $V_{REF}$, for use by a sample-hold phase detector 50. The sample-hold phase detector 50 is synchronized to look at each peak of the differential voltage signal $V_{DIFF}$. The sample-hold phase detector 50 provides a bipolar signal, $V_{SH}$, that is squared up with a comparator 52, which provides a square wave output signal, $V_{OUT}$. Waveforms of the sample-hold phase detector output signal $V_{SH}$ and the comparator square wave output signal $V_{OUT}$ are shown in FIGS. 10B and 10C.

It should be noted that two of the above-described channels may be phase displaced by ¼-cycle along the track of conducting lands 24 in order to provide direction sensing in the conventional manner.

It should also be noted that the conducting traces 26 provide for absolute reference position reading. The middle conducting trace 26" provides a true reference position signal, and the inner 26' and outer 26''' conducting traces provide complementary signals. Thus, the inner 26' and outer 26''' conducting traces enhance the field modulation of the middle conducting trace 26" for the third set of sensor coil windings 38 and the fourth set of sensor coil windings 40. Depending upon the application, the track of conducting traces 26 can yield single or multiple reference positions, perhaps identified by angular width or a special code. The readings provided from the track of conducting traces 26 may also be combined with readings from the track of conducting lands 24 for absolute angle encoding. For this purpose, the track of conducting traces 26 yields a serial code for absolute position with increased resolution from the track of conducting lands 24. Thus, an economical absolute encoder is accomplished with rugged magnetic technology.

Referring to FIG. 11, there is shown an oscillator circuit 54 for generating an AC current $i_r$ at a carrier frequency $f_r$ for driving the electrical coil 16 on the ferrite core head 12. The electrical coil 16 is part of a resonant tank circuit 78, which also includes a discrete charging capacitor 56. The oscillator circuit 54 comprises a pair of switching MOSFET's 58 and 60, a pair of MOSFET gate coil windings 62 and 64, a pair of voltage dividing resistors 66 and 68, a pair of input bias resistors 70 and 72, a +5 VDC voltage supply 74, and an initialization circuit 76.

The initialization circuit 76 comprises a delay circuit 80 that is coupled to the +5 VDC voltage supply 74. The delay circuit 80 is also transformer coupled to the gate of the switching MOSFET 60 through a transformer 82. After the +5 VDC voltage supply 74 comes on-line, the delay circuit 80 provides a delayed start pulse at the gate of the switching MOSFET 60. This delayed start pulse results in a start current pulse being injected into the resonant tank circuit 78 comprising the main coil winding 16 and the charging capacitor 56. Thereafter, the switching MOSFET's 58 and 60 periodically inject sustaining current pulses into the resonant tank circuit 78. The switching MOSFET's 58 and 60 are driven by a combination of AC and DC voltages derived from the MOSFET gate coil windings 62 and 64 and the +5 VDC voltage supply 74, respectively. The MOSFET gate coil windings 62 and 64 are wrapped around the ferrite core head 12 (not shown in FIG. 1) so as to provide feedback signals for driving the gates of the switching MOSFET's 58 and 60. The +5 VDC voltage supply 74 is divided down by the voltage dividing resistors 66 and 68 so as to provide a DC offset voltage at the gates of the switching MOSFET's 58 and 60. The input bias resistors 70 and 72 provide DC voltage return from the gates of the switching MOSFET's 58 and 60 for dynamic reasons.

The preferred carrier frequency $f_r$ for the magnetic encoder 10 is chosen out of consideration for the available high permeability core materials, signal induction factors, and EMI concerns. Low-loss ferrites are a good choice for frequencies in the low megacycle range. As illustrated above, the main coil winding 16 is fed from the oscillator circuit 54. The charging capacitor 56, which resonates with the main coil winding 16 at the carrier frequency $f_r$, is highly desirable to minimize the power required. Thus, the preferred solution is to let the LC resonance of the main coil winding 16 and the charging capacitor 56 determine the carrier frequency $f_r$ since an exact value is not critical and reasonable component tolerances and temperature effects can be accommodated. The oscillator circuit 54 accomplishes this by synchronizing the gate switching of the switching MOSFET's 58 and 60 with the normal free oscillation in the resonant tank circuit 78. Thus, there is no need for a separate frequency source and tuning control for the oscillator circuit 54.

Although the present invention has heretofore been described as being used with a rotary encoder, the same concepts can also be applied to a linear encoder. Furthermore, although the sensor coil windings have heretofore been described as having several loops for forming closed areas, only one closed loop is necessarily required. It should be noted, however, that multiple loops generally provide for stronger signals.

The present invention is not to be limited in scope by the specific embodiment described herein. Indeed, various modifications of the present invention, in addition to those described herein, will be apparent to those of skill in the art from the foregoing description and accompanying drawings. Thus, such modifications are intended to fall within the scope of the following appended claims.

What is claimed is:

1. A magnetic encoder comprising:
    at least one electrical coil disposed along and coplanar with a substantially level plane;
    means for generating an oscillating magnetic field directed toward said at least one electrical coil at an angle substantially perpendicular to said level plane; and
    a plurality of conducting elements disposed on a continuously movable, non-magnetic member that moves relative to said at least one coplanar coil within said oscillating magnetic field, including a plurality of discontinuous conducting lands and at least one adjacent conducting trace having an independent predetermined coded pattern, said conducting elements being disposed along a path substantially parallel to said level plane when proximate to said at least one electrical coil, wherein a plurality of said conducting lands are proximate to said at least one electrical coil such that the movement of said non-magnetic member is sensed by employing said at least one electrical coil to detect eddy currents caused by movement of said conducting elements relative to said magnetic field.

2. The magnetic encoder as defined in claim 1, wherein said at least one electrical coil comprises a pair of sensor coil windings.

3. The magnetic encoder as defined in claim 2, wherein said pair of sensor coil windings are connected in series.

4. The magnetic encoder as defined in claim 3, wherein said series connected pair of sensor coil windings yield an induced differential voltage signal.

5. The magnetic encoder as defined in claim 2, wherein said pair of sensor coil windings are formed on a separate layers of a multilayer printed circuit board.

6. The magnetic encoder as defined in claim 5, wherein said pair of sensor coil windings are superposed over each other.

7. The magnetic encoder as defined in claim 5, wherein said pair of sensor coil windings are offset from each other.

8. The magnetic encoder as defined in claim 1, wherein said means for generating an oscillating magnetic field comprises a ferrite core and an electrical winding.

9. The magnetic encoder as defined in claim 8, wherein said ferrite core has an air gap area across which said oscillating magnetic field is directed.

10. The magnetic encoder as defined in claim 9, wherein said at least one electrical coil is disposed within said air gap area.

11. The magnetic encoder as defined in claim 8, wherein said electrical winding is driven with an AC current that is oscillating at a carrier frequency.

12. The magnetic encoder as defined in claim 11, wherein said carrier frequency is determined by the resonance of said electrical winding and a charging capacitor.

13. The magnetic encoder as defined in claim 1, wherein said conducting elements include a track of radially positioned conducting lands formed on a disc.

14. The magnetic encoder as defined in claim 13, wherein said disc is mounted for rotation such that said track of radially positioned conducting lands move within said oscillating magnetic field proximate said at least one electrical coil along a path substantially parallel to said level plane.

15. The magnetic encoder as defined in claim 14, wherein said disc is fabricated of a material that is transparent to magnetic fields.

16. The magnetic encoder as defined in claim 1, wherein said at least one conducting element comprises a track of concentrically positioned conducting traces formed on a disc.

17. The magnetic encoder as defined in claim 16, wherein said disc is mounted for rotation such that said track of concentrically positioned conducting traces move within said oscillating magnetic field proximate said at least one electrical coil along a path substantially parallel to said level plane.

18. The magnetic encoder as defined in claim 17, wherein said disc is fabricated of a material that is transparent to magnetic fields.

19. A method for sensing position and direction, said method comprising the steps of:

generating an oscillating magnetic field directed toward at least one electrical coil, said at least one electrical coil being disposed along and coplanar with a substantially level plane, said oscillating magnetic field being directed toward said at least one coplanar electrical coil at an angle substantially perpendicular to said level plane;

moving continuously a plurality of conducting elements including a plurality of discontinuous conducting lands and at least one adjacent conducting trace having an independent predetermined coded pattern disposed on a non-magnetic member through said oscillating magnetic field along a path that is substantially parallel to said level plane and proximate said at least one electrical coil wherein a plurality of said conducting lands are proximate to said at least one electrical coil; and sensing an induced voltage in said at least one electrical coil due to modulations in said oscillating magnetic field caused by eddy current magnetic fluxes generated via each said conducting element as a result of moving through said oscillating magnetic field.

* * * * *